Oct. 11, 1966 R. F. RUTZ 3,278,814

HIGH-GAIN PHOTON-COUPLED SEMICONDUCTOR DEVICE

Filed Dec. 14, 1962

INVENTOR
RICHARD F. RUTZ

BY John F. Ohlandt Jr.

ATTORNEY

United States Patent Office 3,278,814

Patented Oct. 11, 1966

3,278,814

HIGH-GAIN PHOTON-COUPLED SEMICONDUCTOR DEVICE

Richard F. Rutz, Cold Spring, N.Y., assignor to International Business Machines Corporation, New York, N.Y., a corporation of New York Filed Dec. 14, 1962, Ser. No. 244,682
9 Claims. (Cl. 317—235)

This invention relates to signal translating devices utilizing semiconductor bodies and in particular to such devices which involve the phenomenon of recombination radiation.

It has previously been discovered that in certain semiconductor materials which are appropriately doped, that is, contain impurities at the proper concentrations, and, with a bias applied to a junction that is formed in these materials, efficient light emission may be obtained due to recombination radiation. For a discussion of the subject, reference may be made to an article by R. W. Keyes and T. M. Quist in the Proceedings of the IRE, vol. 50, p. 882 (1962).

Recombination radiation, as that term is understood in the semiconductor art, refers to a phenomenon where charge carriers, that is, holes and electrons, recombine and produce photons. The recombination process, per se, involves annihilating encounters between the two types of charge carriers within a semi-conductor body whereby the carriers effectively disappear. Certain kinds of recombinations have been known to produce radiation but until recently such radiation has been inefficiently produced.

It is a primary object of the present invention to exploit in a unique manner this newly discovered, highly efficient, recombination radiation phenomenon.

Another object is to provide a semiconductor device in which recombination radiation takes place so as to produce a current gain greater than unity.

A more specific object is to provide a semiconductor device having at least four zones or regions wherein recombination radiation occurs at several junctions within the device.

The signal translating device of the present invention can be most easily described by using transistor nomenclature since the "black box" description in terms of currents and potentials at the accessible terminals is quite similar to the well-established transistor characteristics. Thus, reference will be made hereinafter to the conventional regions of emitter, base and collector, as with the ordinary transistor. However, these terms should not be confused with terms which shall be used to later describe the emission and absorption of photons which occur in various places within the device of the present invention.

Transistors, as they have become known in the past decade or so, have found wide application as signal translating devices such as in amplifiers, oscillators, modulators, etc. The earliest type of transistor was that known as a point contact transistor. More prominently utilized today is the type known as a junction transistor wherein several junctions are defined by contiguous regions within the semiconductor body, which regions vary in conductivity type. Usually this variation is an alternation between what is known as p conductivity-type, wherein the majority carriers are holes and n conductivity-type, wherein the majority carriers are electrons. In general, semiconductor devices have involved injection of carriers into a zone or zones within the semiconductor body. These injected carriers are of a sign opposite those normally present in excess within the zone. Injection is an operating feature of the conventional junction transistor wherein minority carrier injection is controlled in accordance with signals to be translated. Except for the acceleration of carriers through the base region due to the creation of a drift field in certain specialized transistor devices, the movement of carriers is ordinarily solely by diffusion. The injected minority carriers diffuse through the base region over to a collecting junction where they affect the reverse bias current of the collecting junction. Generally speaking, the widths of the base region are required to be smaller than the average diffusion length for the injected minority carriers. This diffusion length is often expressed as $L=\sqrt{D\tau}$ where D is the diffusion and $\tau$ is the lifetime of the minority carriers. Also, since the thickness of the base region determines the transit time of injected minority carriers therethrough, for a given diffusion constant, a severe requirement is imposed on the thickness of this region if it is desired to operate at extremely high frequencies.

With the device of the present invention the thickness requirement, for regions where transport occurs, can be relaxed and yet high speed operation can still be obtained due to the fact that light propagates at a much higher velocity than is obtainable with diffusion or drift mechanisms.

A broad feature of the present invention resides in the provision of a semiconductor device using light as the transporting medium rather than depending on the transport of charge carriers. Another broad feature resides in the provision of a collector structure for a semiconductor device wherein current multiplication is effected, based upon internal feedback mechanisms involving emission and absorption of radiation. A more specific feature resides in the provision that radiation which is emitted at the input junction of the semiconductor device is initially absorbed at a first, reverse biased collector junction, which in turn causes further emission of radiation at or near another forward biased junction, forming part of the collector structure of the device.

The foregoing and other objects, features and advantages of the invention will be apparent from the following more particular description of preferred embodiments of the invention, as illustrated in the accompanying drawings.

Although reference will be made hereinafter to the substance, GaAs, as a suitable semiconductor material wherein the phenomenon of recombination radiation may be exploited, it should be borne in mind that the concept of the present invention is not necessarily limited to this one material and that other suitable wide band gap materials can also be utilized.

Figure 1:
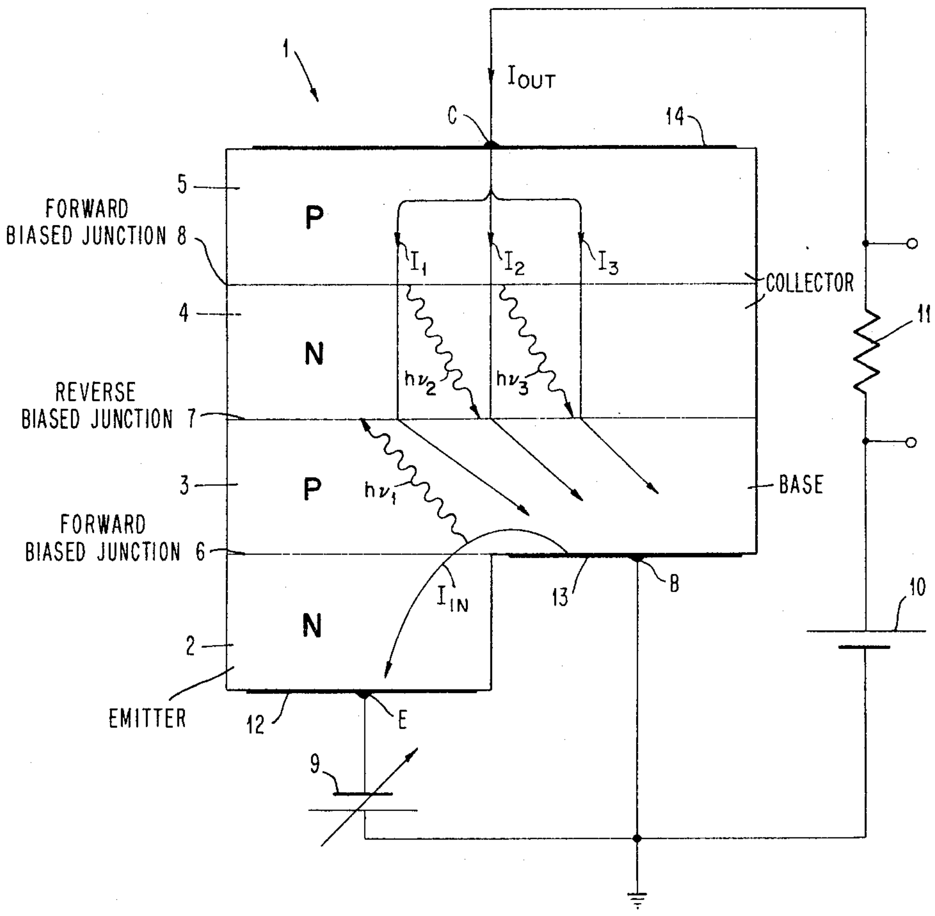
FIGURE 1 is a schematic diagram of a semiconductor device in accordance with the present invention, shown connected in a circuit.

Referring now to FIGURE 1 there is shown a semiconductor body, preferably monocrystalline GaAs, generally indicated by reference numeral 1. The body 1 is constituted of four regions alternating in conductivity type. The emitter region 2 is of n conductivity-type, the base region 3 of p conductivity type and the regions 4 and 5 which shall be denoted collector regions are of n and p type respectively. A first junction 6 is defined by emitter and base regions 2 and 3, a second junction 7 is defined by regions 3 and 4 and a third junction 8 by regions 4 and 5. A voltage source, shown as a variable battery, labeled 9 in the figure is so connected to the emitter and base regions 2 and 3 as to forward bias the junction 6. Another voltage source 10 is connected to provide reverse bias of p-n junction 7 and at the same time to provide forward bias of p-n junction 8. Resistor 11 is connected to voltage source 10 and the output is taken across this resistor, as is standard. The conventional circuit current flow is indicated by the arrows labeled $I_{in}$ and $I_{out}$. Emission and propagation of photons, as will be discussed hereinafter, is schematically shown by the several arrows, labeled $h\nu$.

In the operation of the device of FIGURE 1, with forward bias imposed on the base-emitter junction 6, injection of charge carriers occurs. Recombination radiation then takes place within the GaAs body 1 at or near the junction 6. This process is highly efficient and is thought to approach 100% efficiency in the conversion of injected carriers into photons. The photons produced by the injection of carriers at or near the junction 6 are schematically indicated by the symbol $h\nu$ which is indicative of the energy of a single photon since $h$ is Planck's constant and $\nu$ is the frequency of the radiation.

It should be emphasized at this juncture that the criterion normally applicable to conventional transistor action is that preference be given at the base-emitter junction to injection of charge carriers into the base region, the injected carriers being minority carriers in the base region. It is these minority carriers that should constitute the major contribution to current flow in the input circuit. However, in the case of the present invention this criterion does not necessarily apply since a highly efficient emission of photons at or near the input junction serves the same end. It is this emission of photons which determines the efficiency of operation of the device of the present invention in the case where the base region is too wide to allow appreciable diffusion of minority carriers across it.

The photons of radiation $h\nu_1$, which travel across the relatively thick base region 3, are absorbed upon striking the reverse biased p-n junction 7 and are converted thereupon into charge carriers. Due to this conversion into charge carriers current flows through the output circuit. The total current flow is indicated by the arrow labeled $I_{out}$.

Consider, for the case illustrated in FIGURE 1 where the base width is appreciably greater than the diffusion length of minority carrier injected at junction 6, current $I_{in}$ entering the base electrode labeled B in FIGURE 1 and causing the emission of photons, discussed above, which when absorbed and converted to charge carriers at p-n junction 7 gives rise to a first component of collector current denoted $I_1$. $I_1 = I_{in} \times \eta_0$ where $\eta_0$ equals $g_{6-7}e_6a_7$, $g_{6-7}$ representing the geometrical efficiency which is a measure of loss in the bulk and at exposed surfaces in so far as photons are concerned, $e_6$ representing the radiation emission efficiency of the junction 6 and $a_7$ representing the absorption-collection efficiency of junction 7.

The component of collector current $I_1$ thus generated flows through junction 8, which junction has a forward bias applied to it due to the fact that voltage source 10 has its positive side connected to p region 5 and its negative side to p region 3. Due to the increased current flow through junction 8, which involves injection of charge carriers, radiation emission labeled $h\nu_2$, occurs at or near this junction in the same manner as discussed with reference to junction 6. This radiation $h\nu_2$ propagates through the relatively thick collector region 4 and is absorbed at junction 7. As a result, an additional component of collector current $I_2$ is caused to flow. $I_2 = I_1\eta$ where $\eta$ is an efficiency equal to $g_{8-7}e_8a_7$, where $g_{8-7}$ represents the geometrical efficiency, $e_8$ is the emission efficiency of junction 8 and again, $a_7$ is the absorption collection efficiency of junction 7. Likewise, radiation emission $h\nu_3$, due to $I_2$, causes another component of current $I_3$ to flow, and so on.

The overall effect of current multiplication due to the internal feedback mechanisms can be expressed as $$I_{out} = I_1 + I_2 + I_3 + \ldots = I_{in}\eta_0 + I_1\eta + I_1\eta^2$$

Thus $$I_{out} + I_{in}\eta_0(1 + \eta + \eta^2 \ldots)$$

or $$I_{out} = I_{in} \times \frac{\eta_0}{1-\eta}$$

It has already been experimentally established that $\eta_0$ can be as high as 0.20 and, with no losses, it would approach unity unless an additional multiplication effect were involved such as avalanche multiplication at the collecting junction, in which case values higher than unity could be realized. Since $\eta$ may likewise be made very high it follows that the total current gain readily achieved by the device of the present invention is appreciably greater than corresponding three region devices. The condition for the gain to exceed unity is that $1-\eta$ be less than $\eta_0$ or that $\eta_0 + \eta$ be greater than 1.

The time delay for adding succeeding feedback increments will be primarily the speed of generation and absorption of the light. This speed is of course extremely high and time delays are known to be in the nanosecond region or shorter. Thus the present invention produces a design for a stable, high speed, high gain element with good isolation of the input and output.

The structure of FIGURE 1 may be obtained by a preferred technique such as the following: A wafer is selected of p conductivity type, having a thickness on the order of 5 mils or less, and having an acceptor impurity concentration, such as zinc, on the order of $10^{18}$. An epitaxial vapor deposition of n type GaAs is performed so as to produce two thin n-type surface layers on the order of 1 to 2 mils in thickness. This is, at a concentration of $3 \times 10^{17}$ atoms/cm.$^2$, accomplished by using a typical donor impurity such as tellurium. By a diffusion step using an acceptor impurity such as zinc the surface layer is converted to p conductivity type. At the same time the acceptor will diffuse from region 3 to region 2 forming a graded junction 6 and 7. By this described procedure a five zone stack is realized and it is only necessary then to remove one of the p type surface zones to obtain the structure illustrated in FIGURE 1. Ohmic contacts 12, 13 and 14 are by conventional means affixed to the emitter, base and collector, respectively.

Instead of using this procedure it will of course be apparent to the skilled worker in the art that many other conventional techniques such as double diffusion or alloying, or combinations thereof, may be used so as to yield the structure of FIGURE 1. It will also be obvious that, if desired, the opposite polarity configuration may be attained, that is, rather than a succession of zones, starting with n conductivity type for the emitter, one may start with p conductivity type for the emitter and alternate successively the four required zones. It will likewise be understood that other semiconductor materials may be utilized in the fabrication of the device of FIGURE 1 and even that combinations of epitaxially compatible semiconductor materials may be successfully employed.

Figure 2:
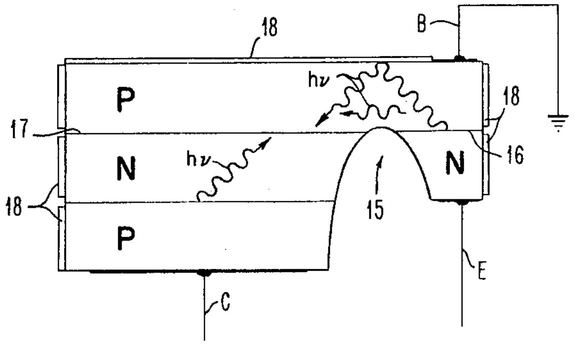
FIGURE 2 illustrates a special geometry for the device.

Referring now to FIGURE 2 there is illustrated a special geometry which provides the same essential operating features as the device embodied in FIGURE 1. However, in the fabrication of the structural configuration of FIGURE 2 a simple three zone semiconductor body is first produced and this can be realized by employing only a single, diffusion, step which has the advantage of providing for uniformity in the formation of the several junctions. The outside p type zones in FIGURE 2 are created by diffusing a typical impurity such as zinc into an n-type wafer. The three zone structure is then processed, such as by etching away a portion of the structure down into the area labeled 15 in FIGURE 2, so as to delimit the base-emitter and base-collector junctions 16 and 17. The device operation is obtained by simple application of the appropriate bias as heretofore indicated in conjunction with the device embodiment of FIGURE 1. The base-emitter junction 16 will produce photon radiation which will travel directly or indirectly, as indicated by the several arrows label $h\nu$, over to the radiation absorbing base-collector junction 17. The indirect path involves reflection from a surface coating 18 which is placed on the semiconductor body to aid in the retention of the photon radiation within the body. A metal may be used for the coating 18, but gaps must then be provided since shorting of the p-n junction must be avoided. In the alternative the coating 18 may be formed by first using an insulator and then adding the metal, thus allowing for complete coating of the entire body.

Although the principles of the present invention have been explained in a limited way by reference to a schematic illustration and to a specialized geometry for the device of the present invention, it will be appreciated that many additional applications of these principles are practicable. Thus, for example, a conventional transistor operation at the input of the device may be provided in conjunction with radiation emission and absorption at the collector of the device. Typically, this can be done by the use of an alloy contact for the emitter of the device where the dimensions are so chosen that minority carrier transport from the emitter junction to the base-collector junction can be exploited and collection of the minority carriers at the collector can then initiate the radiation emission and absorption phenomenon embodied in the collector structure of the device. Additionally, rather than having a four zone structure as illustrated in FIGURE 1 where internal photon propagation is produced in the base region, a three zone structure may be advantageously utilized wherein again the collector structure exhibits the radiation emission and absorption phenomenon and the initiation of the current multiplication process can be produced by the use of an external light source which is directed onto the absorbing region near the collector of the device.

It should also be noted that many kinds and forms of junctions can be utilized such as a tunnel diode junction as the base-emitter junction for the device illustrated in FIGURE 1. Also, it will be obvious that multiple collector and emitter structures can be used to achieve isolation for high fan-in and fan-out in circuit applications.

What has been described in essence is a unique transistor whose operation depends upon light transport and whose operation allows for relatively thick transport regions. In this device current gain greater than unity is achieved due to the effect of current multiplication based upon successive feedback mechanisms involving current flow and radiation absorption and emission in the collector. The light transport transistors such as have been described are expected to have more uniform gain as a function of output current than conventional transistors since the light emission, for example, in GaAs, appears to be proportional to the current flowing in the junction.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A radiation coupled semiconductor device for producing current gain greater than unity comprising,
- an integral crystalline body having first, second and third regions successively alternating in conductivity type, said first and second regions defining a first highly efficient recombination radiation junction for producing recombination radiation due to injection of charge carriers,
- said second and third regions defining a second junction for absorbing radiation,
- means for producing a first quantum of recombination radiation propagating in said third region,
- means for reverse biasing said second junction so as to collect the charge carriers generated upon absorption of said first quantum of recombination radiation at said second junction, and, concurrently, for forward biasing said first junction so as to produce additional recombination radiation due to the increased current flow produced by the collection of charge carriers at said second junction due to said first quantum of recombination radiation.

2. A radiation coupled semiconductor device as defined in claim 1 wherein the crystalline body is composed of GaAs.

3. A radiation coupled semiconductor device for producing current gain greater than unity comprising,
- a monocrystalline body having at least four regions of different conductivity type and having at least three junctions therein,
- a first pair of immediately contiguous regions thereof being of opposite conductivity type thereby defining a first junction, said first junction being a highly efficient recombination radiation junction for producing recombination radiation due to injection of charge carriers,
- a second pair of immediately contiguous regions defining a second junction for absorbing radiation,
- a third pair of immediately contiguous regions defining a third junction, said third junction being a highly efficient recombination radiation junction for producing recombination radiation due to injection of charge carriers,
- means for biasing said first junction so as to inject charge carriers thereby to produce recombination radiation at said first junction, and
- means for reverse biasing said second junction so as to collect the charge carriers generated upon absorption of said recombination radiation at said second junction and, simultaneously therewith, for forward biasing said third junction so as to produce additional recombination radiation due to the increased current flow produced by the collection of charge carriers at said second junction.

4. A radiation coupled semiconductor device as defined in claim 3 wherein the monocrystalline body is composed of GaAs.

5. The radiation coupled semiconductor device of claim 3 wherein said second junction and one of said other junctions is formed in the same plane in said crystalline body.

6. The radiation coupled semiconductor device of claim 5 wherein said first and second junctions are formed in the same plane in said crystalline body.

7. A radiation coupled semiconductor device comprising:
- an integral crystalline body having at least three regions of different conductivity type and having at least two junctions therein defined by said regions,
- two immediately contiguous regions defining a first highly efficient recombination radiation junction for producing recombination radiation due to injection of charge carriers,
- two other immediately contiguous regions defining a second junction for absorbing said radiation,
- and circuit means connected to said device for providing a circuit through said first and second junctions and for forward biasing said first junction and reverse biasing said second junction,
- said reverse biased second junction normally impeding current flow in said circuit through said first and second junctions but collecting charge carriers generated in the vicinity of the second junction to allow current to flow in said circuit through first and second junctions,
- said forward biased first junction when current flows in said circuit through said first and second junctions producing said recombination radiation at least a portion of which is absorbed in the vicinity of said second junction to produce charge carriers at said second junction;

and means for initiating current flow in said circuit through first and second junctions comprising means for applying radiation in the vicinity of said second junction which is absorbed and provides charge carriers which are collected at said second junction.

8. A radiation coupled semiconductor device as defined in claim 7 wherein the integral crystalline body is composed of GaAs, and wherein said at least three regions alternate in succession between p conductivity type and n conductivity type.

9. A radiation coupled semiconductor structure comprising a monocrystalline body having an emitter zone, a base zone and two collector zones, the emitter and a first one of said collector zones being of n conductivity type and the base zone and a second of said collector zones being of p conductivity type, the emitter zone and said first of said collector zones being spaced so as to define separate junctions with said base zone in a single plane within said body, the base zone and said first of said collector zones having a thickness at least several times the diffusion length for minority carriers in said zones, and electrical contacts affixed to said emitter zone, said base and said second of said collector zones.

References Cited by the Examiner

UNITED STATES PATENTS

| | | | |
|---|---|---|---|
| 2,623,105 | 12/1952 | Shockley | 317—235 |
| 2,895,058 | 7/1959 | Pankove | 317—235 |
| 2,910,634 | 10/1959 | Rutz | 317—235 |
| 3,043,958 | 7/1962 | Diemer | 250—211 |
| 3,043,959 | 7/1962 | Diemer | 317—235 |
| 3,058,002 | 10/1962 | Sihvonen | 317—234 |
| 3,089,070 | 5/1963 | Ralph | 317—234 |
| 3,102,201 | 8/1963 | Braunstein et al. | 250—211 |
| 3,196,285 | 7/1965 | Hubner | 307—88.5 |
| 3,200,259 | 8/1965 | Braunstein | 317—235 |

JOHN W. HUCKERT, *Primary Examiner.*

J. D. CRAIG, *Assistant Examiner.*